United States Patent
Herzum et al.

(10) Patent No.: US 9,673,785 B2
(45) Date of Patent: Jun. 6, 2017

(54) PACKAGED MEMS DEVICE COMPRISING ADJUSTABLE VENTILATION OPENING

(71) Applicant: Infineon Technologies AG, Neubiberg (DE)

(72) Inventors: Christian Herzum, Starnberg (DE); Martin Wurzer, Munich (DE); Roland Helm, Munich (DE); Michael Kropfitsch, Koettmannsdorf (AT); Stefan Barzen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/961,186

(22) Filed: Dec. 7, 2015

(65) Prior Publication Data

US 2016/0087606 A1   Mar. 24, 2016

Related U.S. Application Data

(63) Continuation of application No. 13/453,883, filed on Apr. 23, 2012, now Pat. No. 9,210,516.

(51) Int. Cl.
| | |
|---|---|
| *H04R 3/00* | (2006.01) |
| *H04R 29/00* | (2006.01) |
| *H03K 3/01* | (2006.01) |
| *H04R 19/04* | (2006.01) |
| *B81C 1/00* | (2006.01) |
| *B81C 99/00* | (2010.01) |
| *H03G 3/30* | (2006.01) |
| *H04R 19/00* | (2006.01) |

(52) U.S. Cl.
CPC ............. *H03K 3/01* (2013.01); *B81C 1/0023* (2013.01); *B81C 99/0045* (2013.01); *H03G 3/3005* (2013.01); *H04R 19/005* (2013.01); *H04R 19/04* (2013.01); *H04R 29/006* (2013.01); *H04R 2201/003* (2013.01)

(58) Field of Classification Search
CPC  B81C 1/0023; B81C 99/0045; H03G 3/3005; H04R 19/005; H04R 19/04; H04R 2201/003; H04R 29/006
See application file for complete search history.

(56) References Cited

U.S. PATENT DOCUMENTS

| | | |
|---|---|---|
| 5,029,215 A | 7/1991 | Miller, II |
| 7,979,033 B2 | 7/2011 | Rofougaran |
| 2003/0198354 A1 | 10/2003 | Stuart |

(Continued)

FOREIGN PATENT DOCUMENTS

| | | |
|---|---|---|
| CN | 1917720 | 2/2007 |
| CN | 101150888 | 3/2008 |

(Continued)

*Primary Examiner* — Allen Parker
*Assistant Examiner* — Ismail Muse
(74) *Attorney, Agent, or Firm* — Slater Matsil, LLP

(57) ABSTRACT

A packaged MEMS device and a method of calibrating a packaged MEMS device are disclosed. In one embodiment a packaged MEMS device comprises a carrier, a MEMS device disposed on the substrate, a signal processing device disposed on the carrier, a validation circuit disposed on the carrier; and an encapsulation disposed on the carrier, wherein the encapsulation encapsulates the MEMS device, the signal processing device and the memory element.

22 Claims, 6 Drawing Sheets

(56) References Cited

U.S. PATENT DOCUMENTS

| | | | |
|---|---|---|---|
| 2005/0122182 A1* | 6/2005 | Yao | H03L 1/026 331/158 |
| 2008/0075306 A1* | 3/2008 | Poulsen | H04R 19/005 381/111 |
| 2010/0166228 A1 | 7/2010 | Steele et al. | |
| 2011/0167891 A1 | 7/2011 | Geen | |
| 2011/0227188 A1* | 9/2011 | Wang | H01L 27/0207 257/499 |
| 2012/0195797 A1 | 8/2012 | Sparks et al. | |
| 2012/0250925 A1* | 10/2012 | Lillelund | H04R 19/016 381/355 |
| 2013/0109909 A1* | 5/2013 | van Gerwen | H04R 25/43 600/25 |
| 2014/0294226 A1* | 10/2014 | Suvanto | H04R 1/04 381/398 |

FOREIGN PATENT DOCUMENTS

| | | | |
|---|---|---|---|
| CN | 101155442 | 4/2008 | |
| CN | 101627641 | 1/2010 | |
| FI | WO 2012114156 A1 * | 8/2012 | H04R 1/04 |

* cited by examiner

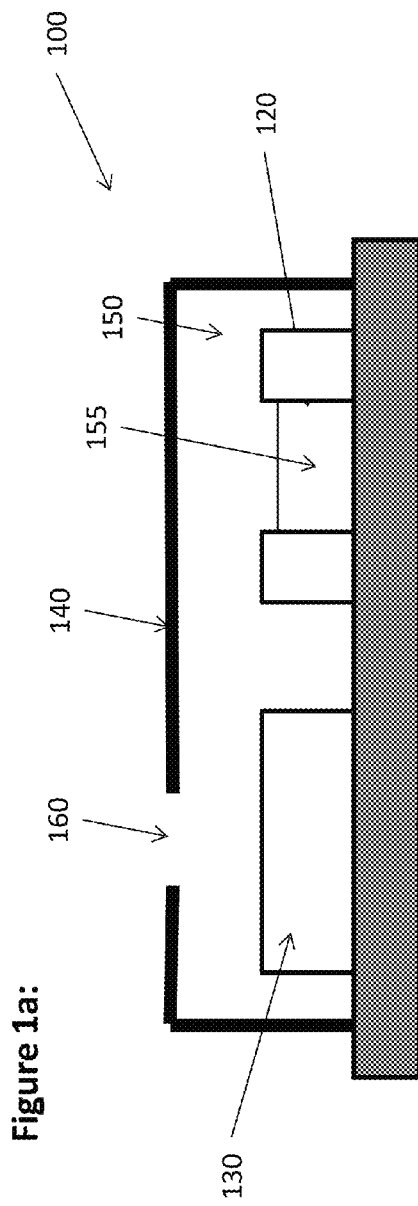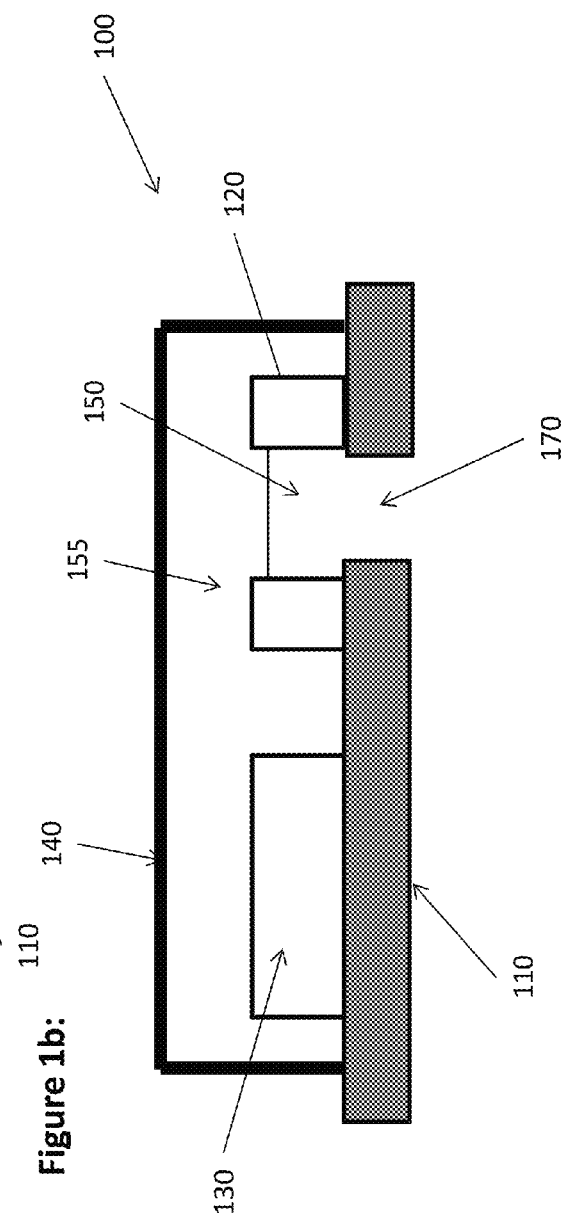
Figure 1a:
Figure 1b:

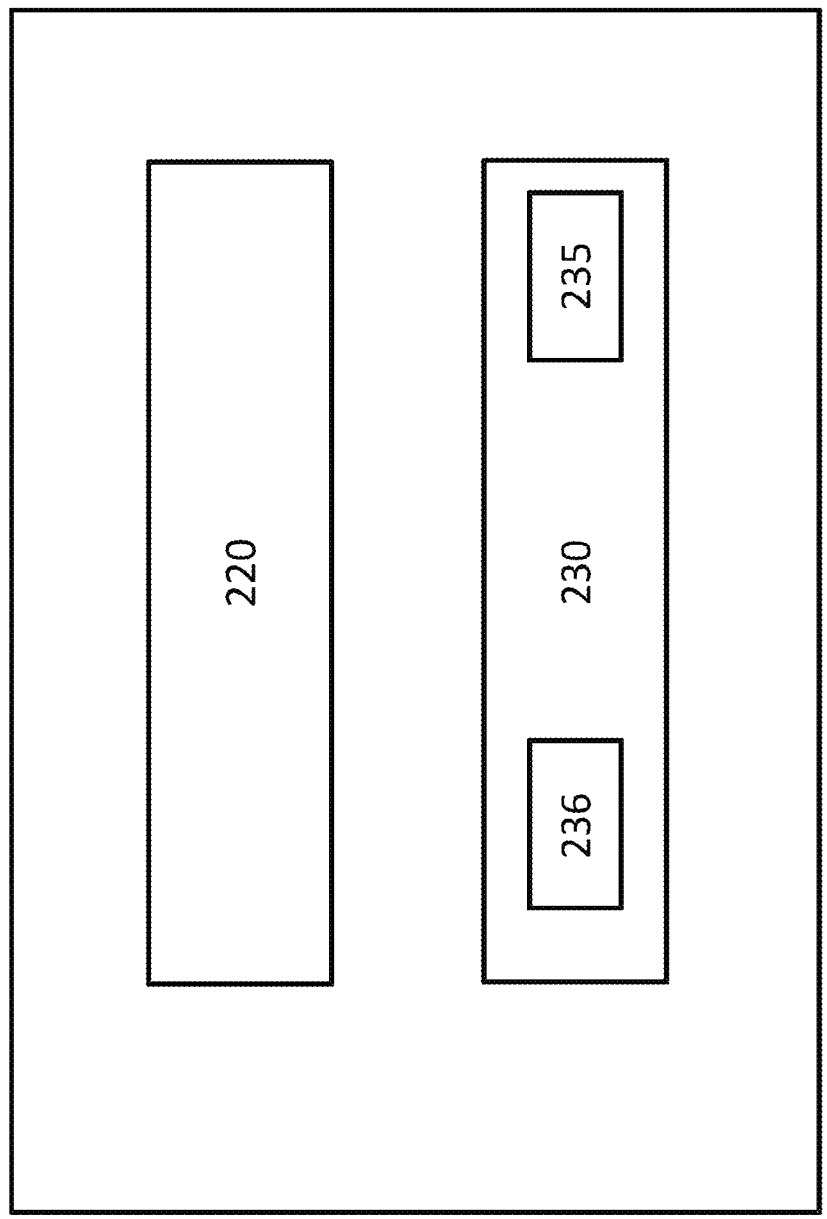

PACKAGED MEMS DEVICE COMPRISING ADJUSTABLE VENTILATION OPENING

This application is a continuation of U.S. patent application Ser. No. 13/453,883, filed Apr. 23, 2012, entitled "Packaged MEMS Device and Method of Calibrating a Packaged MEMS Device," which application is incorporated herein by reference.

TECHNICAL FIELD

The present invention relates generally to an adjustable ventilation opening in a MEMS structure and a method for operating a MEMS structure.

BACKGROUND

A MEMS (MicroElectrical-Mechanical System) microphone comprises a pressure-sensitive membrane or diaphragm disposed in a silicon chip. The MEMS microphone is packaged together with an amplifier. The MEMS microphone and the amplifier may be located on different chips or on the same chip. The MEMS microphone may also include an analog-to-digital converter (ADC) circuit making it a digital MEMS microphone.

SUMMARY OF THE INVENTION

In accordance with an embodiment of the present invention, a packaged MEMS device comprises a carrier, a MEMS device disposed on the carrier, a signal processing device disposed on the carrier, a validation circuit disposed on the carrier; and an encapsulation disposed on the carrier, wherein the encapsulation encapsulates the MEMS device, the signal processing device and the memory element.

In accordance with an embodiment of the present invention, a method of calibrating a packaged MEMS device comprises applying a signal to the packaged MEMS device, measuring a sensitivity of the packaged MEMS device, comparing the measured sensitivity with a target sensitivity of the packaged MEMS device, selecting values for at least one of a bias voltage and an IC gain, and storing the values in a memory element of the packaged MEMS device.

In accordance with an embodiment of the present invention, a method for calibrating a packaged MEMS device comprises measuring a resonance frequency of the packaged MEMS device, comparing the resonance frequency with a target resonance frequency of the MEMS device, selecting values for at least one of a bias voltage and an ASIC gain and storing the values in a memory element in the packaged MEMS device.

In accordance with an embodiment of the present invention, a method for calibrating a packaged MEMS device comprises measuring a first capacitance of the packaged MEMS device for a first bias voltage, measuring a second capacitance of the packaged MEMS device for a second bias voltage and calculating a slope of a difference between the first bias voltage and the second bias voltage, and a first capacitance and a second capacitance. The method further comprises comparing the calculated slope with a target slope, setting values for at least one of a bias voltage and an IC gain, and storing the values in a memory element of the packaged MEMS device.

In accordance with an embodiment of the present invention, a method for calibrating a packaged MEMS device comprises measuring at least one of a sensitivity, a resonance frequency and a capacitance slope of a MEMS device on a wafer or on a singulated die, storing the measured information, assembling the MEMS device to a packaged MEMS device and programming the packaged MEMS device with values based on the stored measured information.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a and 1b show a packaged MEMS device;

FIG. 2 shows an embodiment of a packaged MEMS device;

DETAILED DESCRIPTION OF ILLUSTRATIVE EMBODIMENTS

Figure 3:
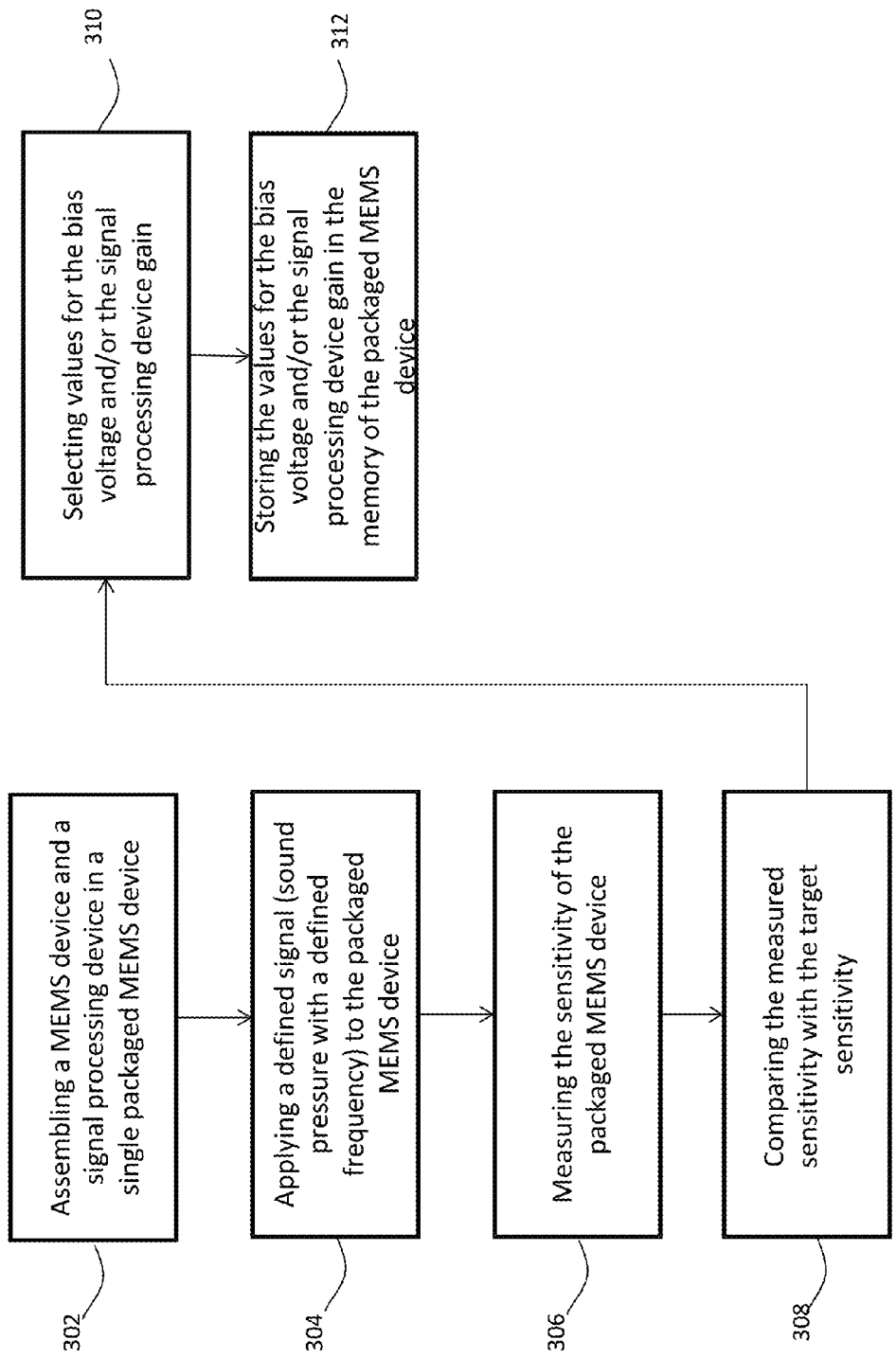
FIG. 3 shows a flowchart of an embodiment of calibrating a packaged MEMS device.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a packaged microphone or sensor. The invention may also be applied, however, to other packaged MEMS devices such as RF MEMS, accelerometers and actuators.

Silicon microphones are used in cell phones, notebooks and other devices. There is a trend to use more than one microphone per device, e.g., for noise cancellation or directionality. In those applications, each microphone should have substantially equal sensitivity, i.e. low sensitivity tolerances may be required.

For silicon microphones sensitivity tolerances of +/−3 dB are typical. However, for multiple microphone applications as described above narrower sensitivity tolerances such as +/−1 dB may be required.

However the MEMS manufacturing process often produces MEMS devices with sensitivity tolerances of more than +/−3 dB or even more than +/−5 dB sensitivity. Sensitivity tolerances may even become worse when the MEMS device is packaged together with a signal processing device into a packaged MEMS device.

In an embodiment the packaged MEMS device is calibrated by measuring the sensitivity of the movable electrode directly in the packaged MEMS device. In another embodiment the packaged MEMS device is calibrated by measuring the resonance frequency of the packaged MEMS device. In yet another embodiment the packaged MEMS device is calibrated by measuring the capacitance slope of the packaged MEMS device. Finally, in an embodiment the packaged MEMS device comprises a memory element.

FIGS. 1a and 1b show a cross sectional view of a packaged MEMS device 100 such as a packaged silicon microphone. The packaged MEMS device 100 device comprises a carrier 110, a MEMS device 120, an integrated circuit 130, and an encapsulation 140 providing a front volume 150 and a back volume 155. The packaged MEMS device 100 may comprise a hole 160 in the encapsulation (FIG. 1a) or a hole 170 in the carrier 110 (FIG. 1b). The MEMS device 120 may be a single chip or die and the signal processing device 130 may be a single chip or die. Alternatively, the MEMS device 120 and the signal processing device 130 may be an integrated single monolithic chip or die.

The carrier 110 may be a ceramic, a printed circuit board (PCB) or a similar substrate. The MEMS device 110 may be a microphone, pressure sensor or a transducer. The MEMS device 110 is disposed on the carrier 110 using adhesive material for example. The MEMS device 110 may be flip chip or bonded such that the contacts facing away from the carrier 110. The signal processing device 130 may be a signal processing circuit, an amplifier circuit, an ADC or combinations thereof. The MEMS device 120 and the signal processing device are electrically connected via bond wires or conductive lines in the carrier 110.

The encapsulation or casting 140 may be an acoustic package. The encapsulation 140 protects the MEMS device 120 and the signal processing device 130 against environmental influences such as mechanical damage. The encapsulation 140 may comprise polymer material.

FIG. 2 shows a block-diagram of a package MEMS device 200. The packaged MEMS device 200 comprises a MEMS device 220, a signal processing device 230, a memory device or element 235, and a validation circuit 236.

The MEMS device 220 comprises a circular membrane or diaphragm or a rectangular diaphragm. Alternatively, the MEMS device 220 comprises a diaphragm with a different suitable geometrical form. The MEMS device 220 may comprise a capacitive actuation, a piezoelectric actuation or a thermal actuation. The signal processing device 230 may be a preamplifier, an amplifier, an analog to digital converter (ADC) or a combination thereof. The signal processing device 230 may be an ASIC.

The memory element 235 may be integrated into the signal processing device 230 (such as an embedded flash memory) or may be a stand-alone device. The memory element 235 may be volatile memory or non-volatile memory. The non-volatile memory element 235 may be a flash memory (NOR and NAND type), a magneto resistive RAM (MRAM), a conductive bridging RAM (CBRAM), a ferroelectric RAM (FeRAM), a phase change memory (PCRAM), or a SONOS. Alternatively, the memory element 235 may be a fuse or a plurality of fuses. The volatile memory element 235 may be a DRAM or a SRAM.

The validation circuit 236 may be integrated in the signal processing device 230. The validation circuit may be configured to measure a signal. The signal to be measured may be an amplitude of an output signal for a sensitivity measurement. Alternatively the signal to be measured may be an impedance of the packaged MEMS device 220. The packaged MEMS device 220 may comprise an additional test pin.

The packaged MEMS device may be manufactured comprising the following steps: optionally forming a hole in the carrier to expose a portion of the MEMS device; disposing a first chip comprising a MEMS device such as a transducer on the carrier; disposing a second chip comprising a signal processing device on the carrier; electrically connecting the first chip and the second chip; encapsulating the MEMS device and the signal processing device with an encapsulation material (package); and optionally forming a hole in the encapsulation material.

Alternatively, the packaged MEMS device is manufactured as follows: optionally forming a hole in the carrier to expose a portion of the MEMS device, disposing an integrated chip comprising the MEMS device (transducer) and the signal processing device on the carrier, encapsulating the carrier with an encapsulation material (package), and optionally forming a hole in the encapsulation material.

In an embodiment the packaged MEMS device is calibrated by measuring the sensitivity of the packaged MEMS device, e.g., the silicon microphone directly in the packaged MEMS device. As the packaged MEMS device sensitivity is eventually the parameter to be controlled, any possible influences from the signal processing device and the package itself are included. FIG. 3 shows a flow chart of a calibration of the packaged MEMS device. The proposed calibration procedure includes the following steps: The MEMS device and the signal processing device are assembled in a single MEMS device package, e.g., microphone package (step 302). A defined signal to the packaged MEMS device is applied (step 304). The applied signal may have a defined sound pressure at a defined frequency. For example, the defined sound pressure is in a range of about 60 dB sound pressure level (SPL) to about 110 dB SPL, and the frequency is in a range of about 100 Hz to about 20 kHz. In a particular example, the signal has a sound pressure of about 94 dB SPL and a frequency of about 1 kHz. Alternatively, the defined sound pressure is in the range of about 80 dB SPL to about 100 dB SPL and the frequency is in a range of about 500 Hz to about 5 kHz.

Next, the sensitivity of the packaged MEMS device is measured for the applied signal (step 306). For example, the sensitivity is measured by measuring an amplitude of the output signal as a response of the applied signal. The sensitivity of the packaged MEMS device can be measured with external test equipment or with a validation circuit integrated in the packaged MEMS device and/or the signal processing device. At step 308, the measured sensitivity of the packaged MEMS device is compared with a target sensitivity of the packaged MEMS device. Based on the result, values for the bias voltage and the signal processing gain are selected (step 310). These values may be selected from a lookup table. Finally, at step 312, these values for the bias voltage and the signal processing gain, e.g. ASIC gain, are programmed and stored in the memory element such as a flash device, a non-volatile memory device and/or a fuse structure.

In an embodiment the packaged MEMS device is calibrated by measuring the resonance frequency of the packaged MEMS device. As the MEMS device is a packaged device when the resonance frequency is applied any possible influences from the package itself and the signal processing device are included in the measurement. A separate calibration of the signal processing device is not necessary.

Figure 4:
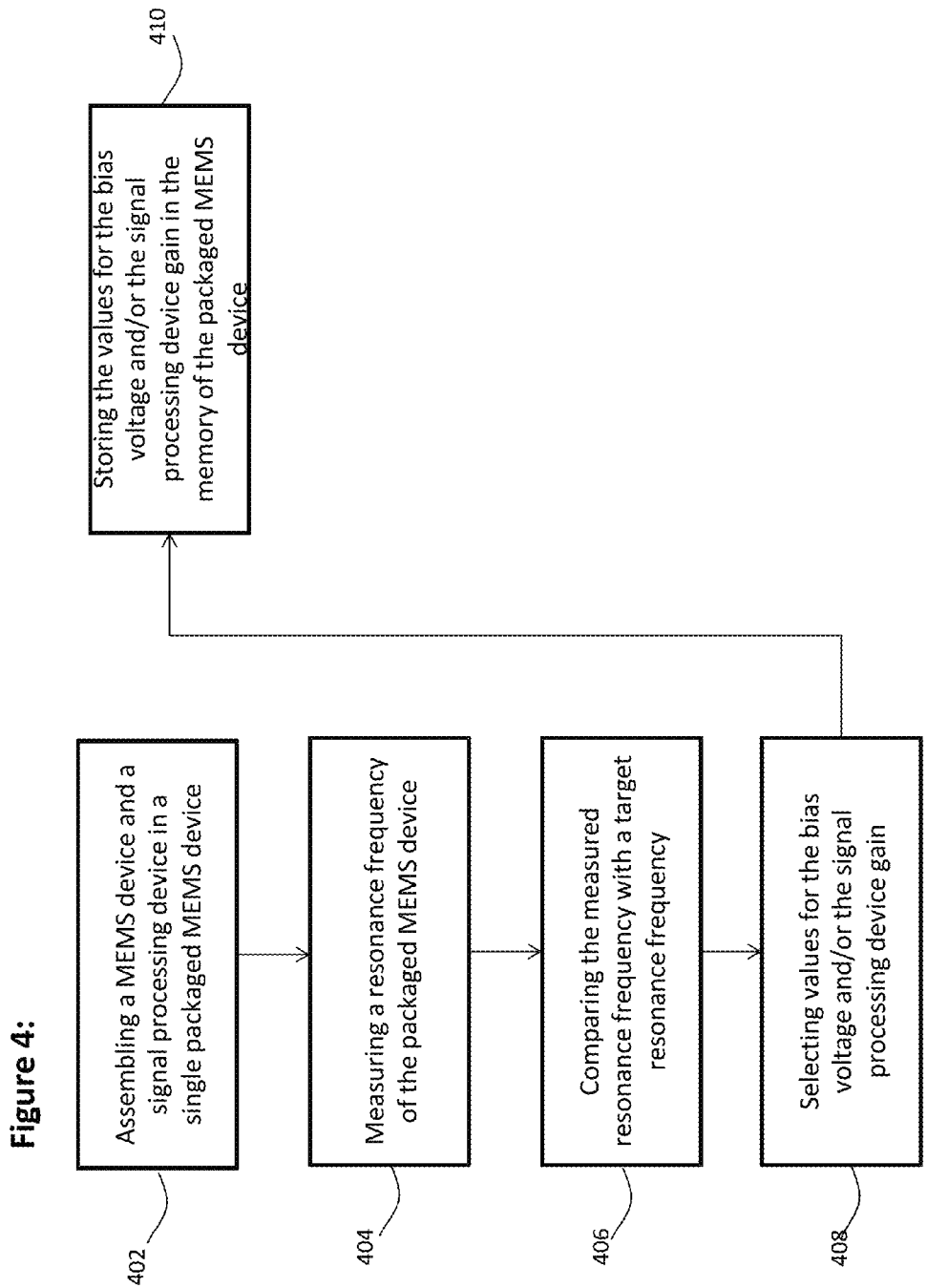
FIG. 4 shows a flowchart of an embodiment of calibrating a packaged MEMS device.

FIG. 4 shows a flow chart for calibrating the packaged MEMS device. The calibration procedure comprises: In step 402, the MEMS device and the signal processing device is assembled in a single MEMS device package, e.g., a microphone package. Then, the resonance frequency of the packaged MEMS device is measured (step 404). The resonance frequency may be measured by applying a DC bias voltage to the packaged MEMS device. The DC bias voltage is in the range for normal operation, e.g., about 0.1V to about 5V or about 0.1V to about 20V. The DC bias voltage is mixed or superimposed with an AC voltage.

The AC voltage may be smaller than the DC bias voltage. For example, the AC voltage may be in the range of 0.1 V to about 0.2 V, alternatively, the AC voltage may be in the range of about 0.1 V to about 0.5 V. The AC voltage may be sinusoidal. Varying the frequency of the sinusoidal voltage, the resonance frequency of the packaged MEMS device can be determined. For example, the resonance frequency can be measured using test equipment such as an impedance analyzer. An advantage is that the resonance frequency has a much better correlation with the MEMS sensitivity than the glitch voltage for example.

The resonance frequency may be measured measuring the impedance of the MEMS packaged MEMS device. For example, the resonance frequency is measured by changing the frequency and measuring the impedance. The minimum of the impedance indicates the resonance frequency. The impedance of the packaged MEMS device can be measured with external test equipment or with a validation circuit integrated in the packaged MEMS device and/or the signal processing device.

Next at step 406, the correlation between resonance frequency and MEMS sensitivity is described as follows:

$$S = \frac{V_{bias}}{x_0} \frac{k}{\rho_{Si} * t * f_{res}^2}$$

wherein $V_{bias}$ is the bias voltage for the packaged MEMS device, $x_0$ is the height of air gap (or the distance between the movable electrode and the counter electrode), $\rho_{Si}$ is the density of the movable electrode material, e.g. silicon, t is the thickness of movable electrode, $f_{res}$ is the resonance frequency of the movable electrode and k is a constant. Resonance frequencies $f_{res}$ are typically measured for a frequency range of about 1 kHz to about 200 kHz or a range of about 5 kHz to about 50 kHz.

The measured resonance frequency $f_{res}$ is compared with a target resonance frequency $f_{res-target}$ (step 406). The packaged MEMS device is calibrated by adjusting the values of the bias voltage and/or signal processing gain (e.g. ASIC gain) so that the measured resonance frequency $f_{res}$ is about the same as the target resonance frequency $f_{res-target}$ (step 408). The new values may be selected from a look-up table. The values of the bias voltage and/or the signal processing gain are programmed to and stored in the memory element of the packaged MEMS device (step 410).

In one embodiment the MEMS device, e.g., microphone, is calibrated by measuring the resonance frequency of the MEMS device itself or the MEMS device chip (and not the resonance frequency of the packaged MEMS device).

Figure 5:
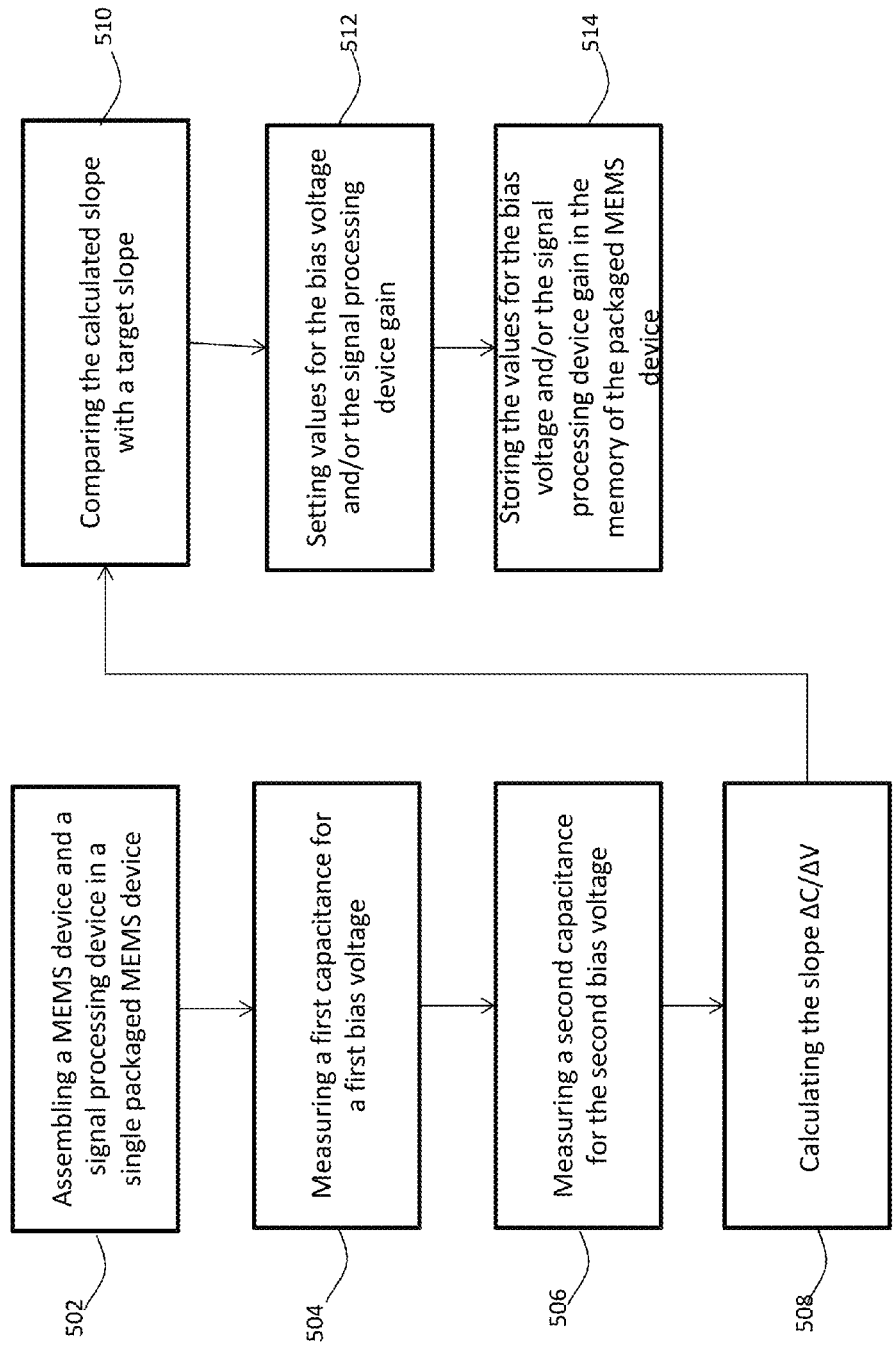
FIG. 5 shows a flowchart of an embodiment of calibrating a packaged MEMS device.

In an embodiment the packaged MEMS device is calibrated by measuring the capacitance slope of the packaged MEMS device for at least two different bias voltages. As the packaged MEMS device sensitivity is eventually the parameter to be controlled, any possible influences from the signal processing device and the package itself are included in the measurement. FIG. 5 shows a flow chart of a calibration of the packaged MEMS device.

The calibration procedure comprises: A MEMS device and a signal processing device is assembled in a packaged MEMS device (step 502). Next, a first capacitance value for a first bias voltage (step 504) is measured and a second capacitive value for a second bias voltage is measured (step 506). Both bias voltages may be smaller than the pull-in voltage. For example, both bias voltages are each below about 4V or each below about 15 volt. In the next step at 508, the slope for C1–C2/V1–V2 (ΔC/ΔV) is calculated. The slope of the packaged MEMS device can be calculated with external test equipment or with a validation circuit integrated in the packaged MEMS device and/or the signal processing device.

Then at step 510, the calculated/measured slope is compared to a target slope. The packaged MEMS device is calibrated by adjusting the bias voltage and/or signal processing gain so that the measured slope is about the same as the target slope (step 512). These values may be selected from a lookup table. Finally at 514, the new values for the bias voltage and/or the signal processing gain are programmed to and stored in the memory element.

In one embodiment the MEMS device, e.g., microphone, is calibrated by measuring the slope of the MEMS device itself or the MEMS device chip (and not the slope of the packaged MEMS device).

In one embodiment the packaged MEMS device is calibrated by a combination of the previous measurements. For example, the packaged MEMS device is calibrated by measuring the sensitivity and the capacitance slope.

Figure 6:
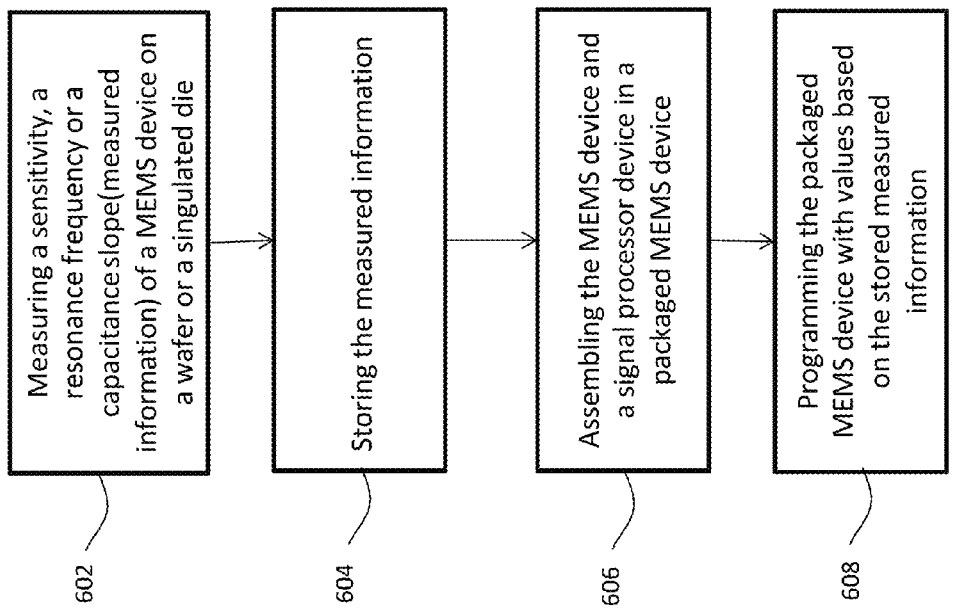
FIG. 6 shows a flowchart of an embodiment of calibrating and packaging a MEMS device.

In an embodiment a MEMS device is calibrated by measuring at least one of a sensitivity, a resonance frequency or a capacitance slope on the device level before the MEMS device is packaged. FIG. 6 shows a flow chart of a calibration and a packaging of the MEMS device.

The calibration procedure comprises: In a first step 602, measuring at least one of a sensitivity, a resonance frequency or a capacitance slope of the MEMS device. The sensitivity, resonance frequency or capacitance slope is measured on the wafer or the singulated die (measured information). The measured information is stored is stored for example on a wafermap (step 604). Next, the MEMS device and a signal processing device is assembled and packaged to a packaged MEMS device (step 606). Finally in step 608, the packaged MEMS device is programmed based on the measured information. For example, the measured information is compared to the target information and values for the bias voltage are selected so that the measured information is about the same as the target information. The values for the bias voltage are stored in the memory element.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A packaged MEMS device comprising:
   a carrier;
   a MEMS device disposed on the carrier;
   a signal processing device disposed on the carrier;
   a memory element storing instructions;
   a validation circuit disposed on the carrier, the instructions upon execution are configured to cause the validation circuit to measure a signal selected from the group consisting of a sensitivity, an impedance and a capacitance slope of the packaged MEMS device, compare the measured signal to a target signal, based on the comparison, select a value for a calibration parameter, calibrate the packaged MEMS device according to the value of the calibration parameter, and store the value of the calibration parameter in the memory element; and an encapsulation disposed on the carrier, wherein the encapsulation encapsulates the MEMS device, the signal processing device and the validation circuit.

2. The packaged MEMS device according to claim 1, wherein the carrier comprises a sound hole.

3. The packaged MEMS device according to claim 1, wherein the memory element comprises a non-volatile memory element integrated in the signal processing device.

4. The packaged MEMS device according to claim 1, wherein the MEMS device and the signal processing device are each disposed in a single chip.

5. The packaged MEMS device according to claim 4, wherein the MEMS device is a silicon microphone and the signal processing device is an amplifier.

6. The packaged MEMS device according to claim 1, wherein the carrier is a PCB, and wherein the encapsulation is an acoustic package.

7. The packaged MEMS device according to claim 1, wherein the calibration parameter comprises bias voltage and signal processing gain.

8. The packaged MEMS device according to claim 1, wherein the validation circuit configured to measure the impedance comprises the validation circuit configured to measure an impedance minimum.

9. The packaged MEMS device according to claim 1, wherein the validation circuit is configured to measure the signal selected from the group consisting of the impedance and the capacitance slope of the packaged MEMS device.

10. A packaged MEMS device comprising:
a carrier;
a MEMS device disposed on the carrier;
a signal processing device disposed on the carrier;
a memory element disposed on the carrier; and
a validation circuit disposed on the carrier, the memory element storing instructions to be executed on the validation circuit, wherein, upon execution, the instructions cause the validation circuit to:
measure a first capacitance of the packaged MEMS device for a first bias voltage;
measure a second capacitance of the packaged MEMS device for a second bias voltage;
calculate a slope of a difference between the first bias voltage and the second bias voltage, and the first capacitance and the second capacitance;
compare the calculated slope with a target slope;
set values for a bias voltage based on comparing the calculated slope with the target slope, wherein the bias voltage is set to adjust a $\Delta C/\Delta V$ slope of the packaged MEMS device to be about equal to the target slope; and
store the values in the memory element of the packaged MEMS device.

11. The packaged MEMS device according to claim 10, wherein the carrier comprises a sound hole.

12. The packaged MEMS device according to claim 10, wherein the memory element comprises a non-volatile memory element monolithically integrated in the signal processing device.

13. The packaged MEMS device according to claim 10, wherein the MEMS device and the signal processing device are each disposed in a single chip.

14. The packaged MEMS device according to claim 13, wherein the MEMS device is a silicon microphone and the signal processing device is an amplifier.

15. The packaged MEMS device according to claim 10, wherein the carrier is a printed circuit board (PCB).

16. The packaged MEMS device according to claim 10, wherein the memory element is a stand-alone device and the MEMS device is a stand-alone device.

17. The packaged MEMS device according to claim 10, wherein the packaged MEMS device comprises a microphone, a sensor, an RF MEMS, an accelerometer, or an actuator.

18. The packaged MEMS device according to claim 10, wherein the validation circuit is further configured to:
set values for a signal processing gain for the signal processing device based on comparing the calculated slope with the target slope, wherein the signal processing gain is set to adjust a $\Delta C/\Delta V$ slope of the MEMS device to be about equal to the target slope; and
storing the values for the signal processing gain in the memory element of the packaged MEMS device.

19. The packaged MEMS device according to claim 18, wherein the signal processing gain is an amplifier gain.

20. A packaged MEMS device comprising:
a printed circuit board;
a MEMS device disposed on the printed circuit board;
a signal processing device disposed on the printed circuit board, the signal processing device comprising a memory element and a validation circuit, the memory element storing instructions to be executed on the validation circuit, the instructions upon execution cause the validation circuit to:
measure a first capacitance of the packaged MEMS device for a first bias voltage;
measure a second capacitance of the packaged MEMS device for a second bias voltage;
calculate a slope of a difference between the first bias voltage and the second bias voltage, and the first capacitance and the second capacitance;
compare the calculated slope with a target slope;
set values for a bias voltage based on comparing the calculated slope with the target slope, wherein the bias voltage is set to adjust a $\Delta C/\Delta V$ slope of the packaged MEMS device to be about equal to the target slope; and
store the values in the memory element of the packaged MEMS device; and
an encapsulation disposed on the printed circuit board, wherein the encapsulation encapsulates the MEMS device and the signal processing device.

21. The packaged MEMS device according to claim 20, wherein the encapsulation comprises a sound hole.

22. The packaged MEMS device according to claim 20, wherein the printed circuit board comprises a sound hole.

* * * * *